Figure 1:
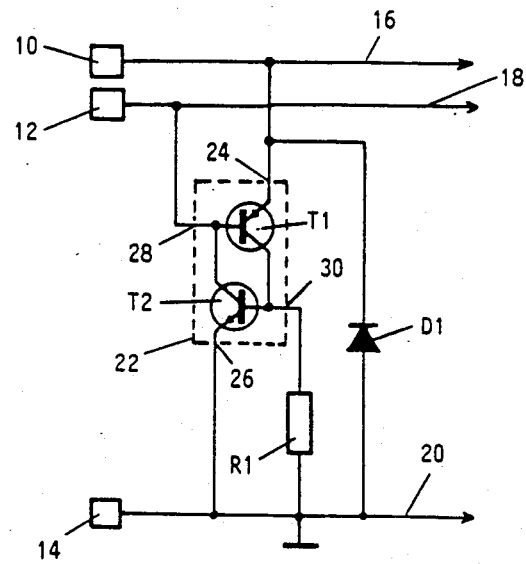

United States Patent [19]

Bucksch

[11] Patent Number: 4,686,602
[45] Date of Patent: Aug. 11, 1987

[54] PROTECTIVE CIRCUIT ARRANGEMENT FOR PROTECTING SEMICONDUCTOR COMPONENTS

[75] Inventor: Walter Bucksch, Freising, Fed. Rep. of Germany

[73] Assignee: Texas Instruments Incorporated, Dallas, Tex.

[21] Appl. No.: 737,962

[22] Filed: May 28, 1985

[30] Foreign Application Priority Data

Jun. 14, 1984 [DE] Fed. Rep. of Germany ....... 3422132

[51] Int. Cl.[4] .............................................. H02H 9/04
[52] U.S. Cl. ...................................... 361/91; 361/56; 361/111; 307/637
[58] Field of Search .......................... 361/56, 91, 111; 307/252 G

[56] References Cited

U.S. PATENT DOCUMENTS

| | | | |
|---|---|---|---|
| 4,071,779 | 1/1978 | Kawanami et al. | 307/252 G |
| 4,302,792 | 11/1981 | Harwood | 361/56 |
| 4,439,802 | 3/1984 | Johansson | 361/91 |
| 4,484,244 | 11/1984 | Avery | 361/56 |
| 4,567,500 | 1/1986 | Avery | 361/56 |

Primary Examiner—Roy N. Envall, Jr.
Assistant Examiner—Jeffrey A. Gaffin
Attorney, Agent, or Firm—Gary Honeycutt; Rhys Merrett; Mel Sharp

[57] ABSTRACT

A protective circuit arrangement is described for protecting semiconductor components connected to input and output terminals (10) against overvoltages in bipolar integrated circuits. The circuit arrangement contains at least one supply voltage terminal (12) and a ground terminal (14). Between the ground terminal (14) and at least the input and output terminals (10) which are connected to components sensitive to overvoltage a thyristor-tetrode (22) having a first control electrode (28) and a second control electrode (30) is inserted, the first control electrode (28) being connected to a line (18) which in the operative state of the integrated circuit lies at a voltage above the ground potential and the second control electrode (30) being connected to the ground terminal 14.

3 Claims, 5 Drawing Figures

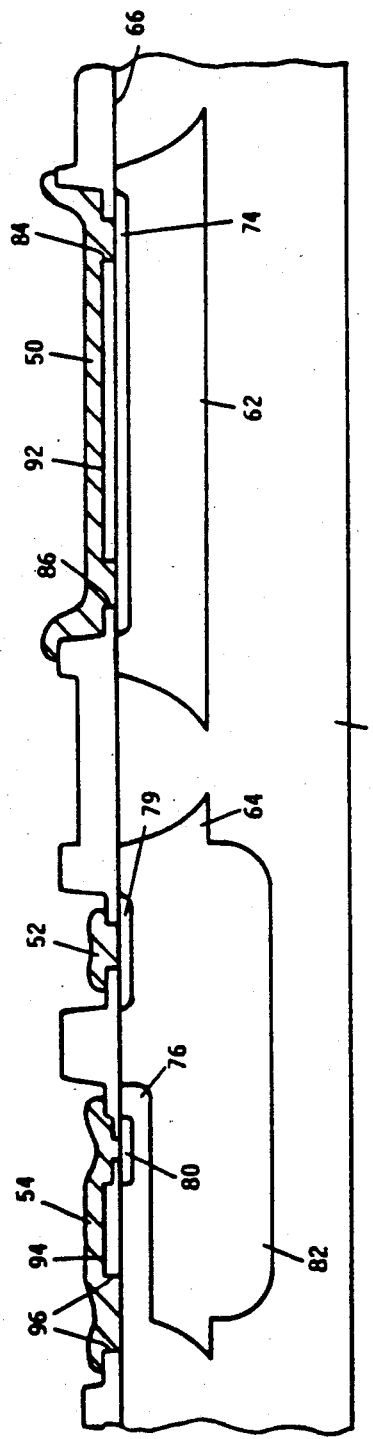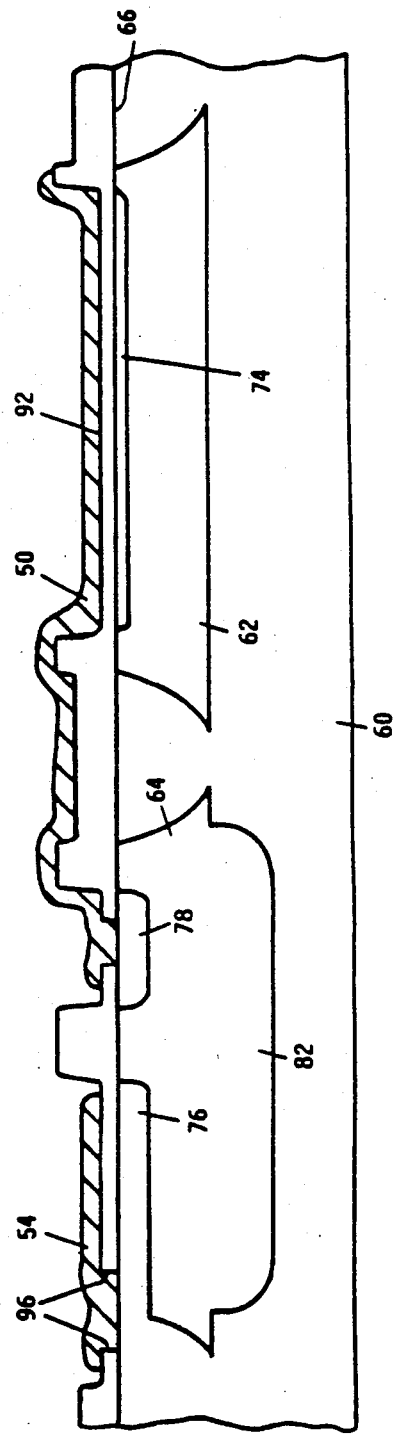

PROTECTIVE CIRCUIT ARRANGEMENT FOR PROTECTING SEMICONDUCTOR COMPONENTS

The invention relates to a protective circuit arrangement for protecting semiconductor components connected to input and output terminals against overvoltages in bipolar integrated circuits which have at least one supply voltage terminal and a ground terminal.

Integrated circuits are often sensitive to overvoltages which due to improper handling reach the input or output terminals and destroy components which are connected to said terminals. Such overvoltages are frequently voltages which arise due to electrostatic charging when the integrated circuits have not yet been installed in the circuits in which they are finally used when they are touched by hand or moved to and fro in transport containers of plastic.

It is known to obtain a protection against overvoltages in that to the input and output terminals in each case the collector of a transistor is connected whose emitter and base are applied jointly to ground. As soon as a voltage which is higher than for example 50 V reaches a terminal the transistor breaks down so that a low resistivity path to ground is formed. The components connected to the terminal thus cannot be damaged by the overvoltage. However, this possibility of protection is restricted in its applications, being in particular unsuitable for the protection of bipolar circuits which are designed for operation with voltages of 50 or 100 V. In integrated circuits which are designed for such operating voltages of the order of magnitude of 50 or 100 V the protective transistor has such a high breakdown voltage that it does not respond at these high operating voltages but at still higher voltages and only then breaks down. If an overvoltage of for example 150 V or more reaches an input terminal protected by such a transistor, although the latter goes into the conductive state due to the high voltage it must take up so much energy that destruction of the transistor and the circuit to be protected results. Thus, irreversible damage occurs which renders the integrated circuit inoperative.

The invention is based on the problem of providing a protective circuit arrangement which can also be used in bipolar circuits which are designed for operation with voltages of the order of magnitude of 100 V.

According to the invention this problem is solved in that between the ground terminal and at least the input and output terminals which are connected to components sensitive to overvoltage a thyristor-tetrode having a first control electrode and a second control electrode is inserted, the first control electrode being connected to a line which in the operative state of the integrated circuit lies at a voltage above the ground potential and the second control electrode being connected to the ground terminal.

The protective circuit arrangement according to the invention protects the components of the integrated circuit partricularly reliably from voltages which reach the input and output terminals when the integrated circuit is not yet in operation, i.e. no supply voltage is present. Even small voltages at the input and output terminals result in the thyristor-tetrode going into the conductive state and thus establishing a connection between the respective input or output terminal and the ground line. In this manner, no voltage which could destroy the components can reach the components in the integrated circuit.

Advantageous further developments of the invention are characterized in the subsidiary claims.

Figure 2:
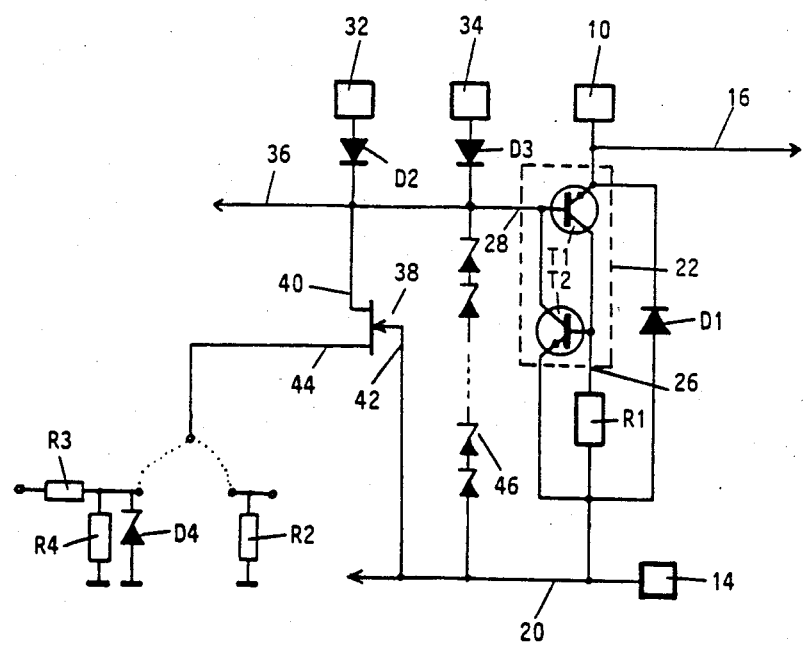
Figure 3:
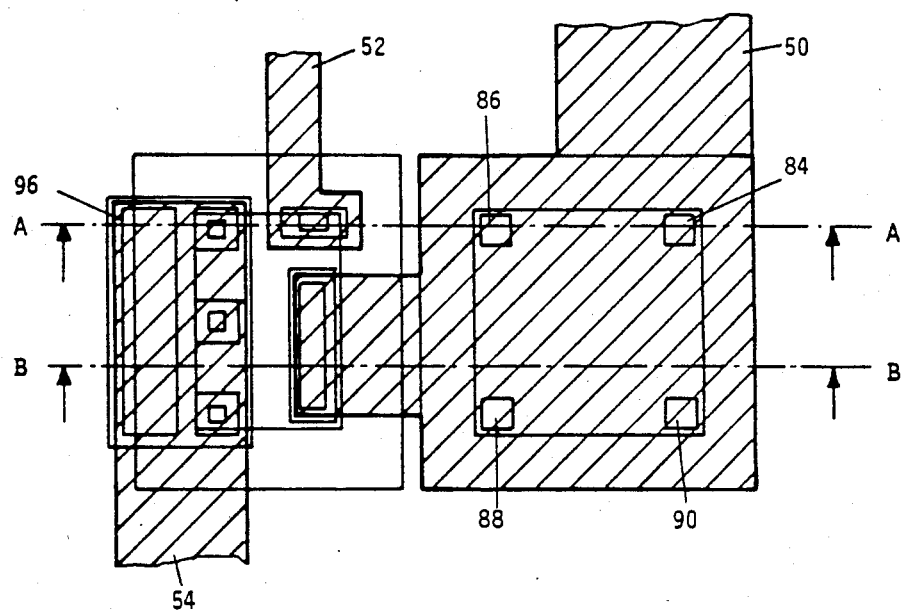

The invention will now be explained by way of example with the aid of the drawings, wherein:

FIG. 1 shows the circuit diagram of the protective circuit arrangement according to the invention, FIG. 2 is a further development of the protective circuit arrangement according to the invention for use in a special type of integrated circuits, FIG. 3 is a plan view of the part of an integrated circuit containing the protective circuit arrangement according to the invention, FIG. 4 is a section along the line A—A of FIG. 3 and FIG. 5 is a section along the line B—B of FIG. 3.

The protective circuit arrangement to be described below is shown in FIG. 1 in the form of an electrical circuit diagram. The protective circuit arrangement is part of a bipolar integrated circuit which contains components sensitive to overvoltages. Of the terminals of the integrated circuits only the input terminal 10, the supply voltage terminal 12 and the ground terminal 14 are shown. The integrated circuit has further input and output terminals which are not shown and with which protective circuit arrangements can also be connected in the manner illustrated in FIG. 1.

In the integrated circuit the components to be protected by the protective circuit arrangement of FIG. 1 are connected to the line 16 connected to the input terminal 10. The line 18 is the supply voltage line of the integrated circuit and the line 20 its ground line.

Between the line 16 and the ground line 20 a diode D1 is inserted which is always conductive when a voltage negative with respect to the ground value is present at the input terminal 10. Negative voltage peaks can therefore be carried away through the diode D1 to ground and consequently cannot produce any destruction in the integrated circuit.

Also connected parallel to the diode D1 between the line 16 and the ground line 20 is a component 22 having a thyristor behaviour. Said component 22 is illustrated to explain its mode of operation with an equivalent circuit diagram comprising two transistors T1 and T2. It comprises an anode 24, a cathode 26 and two control electrodes 28, 30. Said component is usually referred to as thyristor-tetrode because in contrast to a conventional thyristor in addition to the anode and cathode it comprises not only one control electrode but two. As apparent from the circuit diagram, the anode 24 is the emitter of the transistor T1 and the cathode 26 is the emitter of the transistor T2. The transistor T1 is a pnp transistor and the transistor T2 is a npn transistor. The base of the transistor T1 forms the first control electrode 28 which is connected to the collector of the transistor T2 and the base of the transistor T2 forms the second control electrode 30 which is connected to the collector of the transistor T1. The first control electrode 28 is connected to the supply voltage line 18 and the second control electrode 30 is connected via a resistor R1 to the ground line 20.

The purpose of the protective circuit arrangement is to ensure that positive overvoltages which reach the input terminal 10 cannot destroy any components in the integrated circuit which are connected to the line 16. In the range of normal operative voltages for which the integrated circuit to be protected is designed the protective circuit arrangement must however remain inoperative and have no influence on the operation of the integrated circuit.

If during normal operation of the integrated circuit the supply voltage is applied to the supply voltage terminal 12 and the ground terminal 14 is connected to the ground connection of the power source supplying the supply voltage, the transistor T1 is reliably blocked because at its base the highest possible voltage occurring in normal operation is present, in other words at its emitter there is always a voltage which is lower than its base voltage. Since via the emitter-collector path of the transistor T1 even in the nonconductive condition a small leakage current flows it might happen that this leakage current is sufficient to bring the transistor T2 to the conductive condition. As a result the voltage at the base of the transistor T1 would become lower than the voltage at the emitter so that the transistor T1 would also become conductive. The component 22 forming a thyristor-tetrode would therefore ignite which would result in a short circuit between the line 16 and ground line 20. To avoid this undesirable condition occurring in normal operation the connection between the base of the transistor T2 and the ground line 20 of the resistor R1 is inserted. Because of this resistor R1 the transistor T2 cannot become conductive until a threshold value, dependent on the resistance value, of the voltage at the base of the transistor T2 has been reached. The resistor R1 is so dimensioned that said threshold voltage is certainly not exceeded by leakage currents flowing through the transistor T1. The increased response threshold thus produced in the operative state of the integrated circuit can be fixed so that positive voltage peaks which are higher than the supply voltage at the supply voltage terminal 12 but not so high that they lead to destruction in the integrated circuit and do not lead to ignition of the component 22.

When the integrated circuit is not in operation no positive supply voltage is at the supply voltage terminal 12. In the integrated circuit, between the supply voltage terminal 12 and the ground terminal 14 there is a low resistivity direct current connection which defines the current which the integrated circuit takes up in operation. This means that between the base of the transistor T1 and the ground line 20 a low resistivity direct current connection is present. If for example due to electrostatic charging a voltage reaches the input terminal 10 the transistor T1 becomes conductive so that a current flows therein. If the current is high enough to produce due to the voltage drop at the resistor R1 a voltage of at least 0.7 V at the base of the transistor T2 the latter also becomes conductive. The component 22 thus establishes a low-resistance connection between the input terminal 10 and the ground line 20 so that the voltage present at the input terminal 10 is short-circuited to ground and thus no damage can be caused at the components of the integrated circuit connected to the line 16.

As apparent from the above description of the protective circuit arrangement of FIG. 1 a requirement for producing the conductive state of the component 22 by a voltage at the input terminal 10 when the integrated circuit is not in operation, i.e. no supply voltage is at the supply voltage terminal 12, is the presence of a low-resistance direct current connection between the supply voltage terminal 12 and the ground line 20. This direct current path is usually present in an integrated circuit and defines the current taken up in the operative condition. There are however specific integrated circuits in which the protective circuit arrangement described cannot be used in the manner outlined above. These are integrated circuits which are fed from a plurality of supply voltage sources and which are subjected to the condition that they exercise certain functions even when one of these supply voltages fails. To obtain this function in the integrated circuit the two supply voltages are supplied via an OR circuit comprising two diodes to a biasing line. This biasing line supplies certain zones of the integrated circuit, due to the OR connection, with a biasing voltage even when one of the supply voltages is no longer present. Between the biasing line and the ground line there is no direct current connection. The circuit arrangement illustrated in FIG. 2 shows how the protective circuit arrangement according to the invention can be used in an integrated circuit of the type outlined. Of the terminals of this integrated circuit FIG. 2 shows the input terminal 10, the ground terminal 14 and two supply voltage terminals 32 and 34. The supply voltage terminals 32 and 34 lead in the integrated circuit to two supply voltage lines which are not illustrated and which supply the components of the integrated circuit with voltage. Via two diodes D2 and D3 the supply voltage connections 32 and 34 are connected to a biasing line 36 which supplies selected zones in the semiconductor substrate of the integrated circuit with a supply bias. The base of the transistor T1 forming the first control connection 28 is connected to the biasing line 36. As already mentioned above in this type of integrated circuit there is no direct current connection between the biasing line 36 and the ground line 20. However since for satisfactory operation of the protective circuit arrangement a low-resistance direct current connection must be present between the control electrode 28 and ground between the biasing line 36 and the ground line 20 a junction field-effect transistor 38 is inserted whose drain electrode 40 is connected to the biasing line 36 and whose gate electrode 42 is connected to the ground line 20. The source electrode 44 could also be connected to the ground line 20 but in this case the junction field-effect transistor 38 even in the nonconductive state would still permit a residual current to flow which would be undesirably high. To reduce this current the source electrode 44 is connected to a biasing voltage which greatly reduces the drain current. The bias can be taken from points within the integrated circuit at which suitable voltages are available. For example, the bias can be applied to the source electrode 44 alternatively by using the resistor R2 connected on one side to ground or by using the combination of the resistors R3, R4 and the zener diode D4 according to the illustration of FIG. 2.

Between the biasing line 36 and the ground line 20 a zener diode chain 46 is inserted which is provided as protective mechanism only for the case in which the component 22 due to fluctuations of its ratings due to production tolerances does not go into the conductive state on the basis of its normal function.

If in the circuit arrangement of FIG. 2 at the input terminal 10 a high voltage due to electrostatic charging occurs whilst the integrated circuit is not in operation, due to the low-resistance direct current connection produced by the junction field-effect transistor 38 between the base of the transistor T1 and the ground line 20 said transistor T1 becomes conductive which as in the circuit arrangement of FIG. 1 results in the transistor T2 going into the conductive state. The high voltage can thereby be carried away via the component 22 which has a very low resistance when the transistors T1 and T2 are conductive to the ground line 20 without causing damage in the integrated circuit.

The arrangement of the components of the protective circuit arrangement of FIG. 1 described on the semiconductor substrate of an integrated circuit is shown in FIG. 3. The hatched areas 50, 52 and 54 are metal layers with the aid of which the connection between diffusion zones in the semiconductor substrate and the terminals of the integrated circuit can be established. The metal layer 50 leads to the terminal 10, the metal layer 52 to the terminal 12 and the metal layer 54 to the terminal 14. The metal layer 50 establishes a connection to the diode D1 and to the emitter of the transistor T1. The metal layer 52 contacts the base of the transistor T1 and the collector of the transistor T2 and the metal layer 54 contacts the emitter of the transistor T2.

The sectional views of FIGS. 4 and 5 show more clearly the association of the indiviual diffusion zones in the semiconductor substrate of the integrated circuit with the components illustrated in FIG. 1. The integrated protective circuit is formed in a p- type substrate 60. The components of the protective circuit arrangement of FIG. 1 are arranged in two n- type epitaxially formed zones 62 and 64. The cross-hatched layers disposed on the surface 66 of the semiconductor substrate 60 are layers of insulating material and the singly hatched layers the metal layers 50, 52 and 54. Diffused in the zone 62 adjoining the surface 66 of the semiconductor substrate 60 is an n+ zone which permits contacting of the zone 62. In the zone 64 p-type zones 76 and 78 are formed by diffusion. Furthermore, in accordance with the section of FIG. 4 two n+ zones 79 and 80 are formed by diffusion, the latter lying in the p-type zone 76. Beneath the zone 64 a low-resistance layer 82 is formed by diffusion which is generally denoted DUF zone and is always produced under an epitaxially formed zone when npn transistors are disposed in the epitaxially formed zone lying thereabove.

The pn junction between the n- type zone 62 and the p- type substrate 60 is the diode D1 of FIG. 1. The contacting to the anode of said diode D1 is via windows 84 to 90 in the insulating layer 92, of which the windows 84 and 86 are apparent in FIG. 4.

The p- type zone 78 apparent in FIG. 5 is the emitter of the transistor T1 which is connected via the metal layer 50 to the anode of the diode D1. The n+ zone 79 apparent in FIG. 4 acts as base of the transistor T1 and as collector of the transistor T2 connected therewith. Via the metal layer 52 the zone 79 is in connection with the supply voltage terminal 12.

The n+ zone 80 acts as emitter of the transistor T2 which is connected via the metal layer 54 to the ground terminal 14. The metal layer 54 is connected via a window 96 formed in the insulating layer 94 to the p- type zone 76 and the region of the zone 76 on the right of the zone 80 in FIG. 4 acts as collector of the transistor T1 and as base of the transistor T2. The region of the p- type zone 76 lying beneath the insulating layer 94 between the window 96 and the zone 80 acting as emitter of the transistor T2 forms the resistor R1. Said resistor is thus formed by the geometric distance between the region beneath the window 96 and the n+ zone 80.

The entire protective circuit arrangement of FIG. 1 may be made in a very small area of the surface of the semiconduct or substrate 60 so that difficulties are encountered in providing all input and output terminals of integrated circuits sensitive to overvoltages with the protective circuit arrangement.

I claim:

1. Protective circuit arrangement including a bipolar integrated circuit which has at least one supply voltage terminal, an input or output terminal, and a ground terminal, comprising between the ground terminal and the input or output terminal a thyristor-tetrode having a first control electrode and a second control electrode, the first control electrode being connected to a line which in the operative state of the integrated circuit lies at a voltage above the ground potential, and the second control electrode being connected to the ground terminal, wherein said line is a biasing line in the integrated circuit, whereon a bias is present in the operative state, and wherein a junction field-effect transistor is included between the biasing line and ground.

2. Arrangement according to claim 1, characterized in that the source electrode (44) of the junction field-effect transistor (38) is connected to a bias derived from a supply voltage of the integrated circuit.

3. Arrangement according to claim 2, characterized in that the source electrode (44) of the junction field-effect transistor (38) is connected to a circuit point of the integrated circuit at which in the operative state a suitable bias is present.

* * * * *